United States Patent
Kvamme et al.

(10) Patent No.: US 11,112,691 B2
(45) Date of Patent: Sep. 7, 2021

(54) INSPECTION SYSTEM WITH NON-CIRCULAR PUPIL

(71) Applicant: KLA-Tencor Corporation, Milpitas, CA (US)

(72) Inventors: Damon F. Kvamme, Los Gatos, CA (US); Rui-fang Shi, Cupertino, CA (US); Daniel C. Wack, Fredericksburg, VA (US); Sseunhyeun Jo, Cupertino, CA (US); Xin Ye, Shanghai (CN)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/258,118

(22) Filed: Jan. 25, 2019

(65) Prior Publication Data

US 2020/0225574 A1    Jul. 16, 2020

Related U.S. Application Data

(60) Provisional application No. 62/793,027, filed on Jan. 16, 2019.

(51) Int. Cl.
*G03F 1/84* (2012.01)
*G03F 1/72* (2012.01)
*G03F 1/24* (2012.01)

(52) U.S. Cl.
CPC .............. *G03F 1/84* (2013.01); *G03F 1/24* (2013.01); *G03F 1/72* (2013.01)

(58) Field of Classification Search
CPC ............... G03F 1/84; G03F 1/72; G03F 1/24
See application file for complete search history.

(56) References Cited

U.S. PATENT DOCUMENTS

| 6,628,370 B1 * | 9/2003 | McCullough ....... G03F 7/70125 355/53 |
| 8,711,346 B2 | 4/2014 | Stokowski |
| 8,785,082 B2 | 7/2014 | Xiong et al. |
| 8,842,272 B2 | 9/2014 | Wack et al. |

(Continued)

FOREIGN PATENT DOCUMENTS

WO    2009035129 A2    3/2009

OTHER PUBLICATIONS

International Search Report and Written Opinion dated May 6, 2020 for PCT/US2020/012817.

*Primary Examiner* — Qian Yang
(74) *Attorney, Agent, or Firm* — Suiter Swantz pc llo (57) ABSTRACT

An inspection system includes an illumination source configured to generate extreme ultraviolet (EUV) light, illumination optics to direct the EUV light to a sample within a range of off-axis incidence angles corresponding to an illumination pupil distribution, collection optics to collect light from the sample in response to the incident EUV light within a range of collection angles corresponding to an imaging pupil distribution, and a detector configured to receive at least a portion of the light collected by the collection optics. Further, a center of the illumination pupil distribution corresponds to an off-axis incidence angle along a first direction on the sample, and at least one of the illumination pupil distribution or the imaging pupil distribution is non-circular with a size along the first direction shorter than along a second direction perpendicular to the first direction.

36 Claims, 7 Drawing Sheets

(56) References Cited

U.S. PATENT DOCUMENTS

| | | | |
|---|---|---|---|
| 2004/0095638 A1* | 5/2004 | Engel | G02B 21/008 |
| | | | 359/368 |
| 2009/0002789 A1* | 1/2009 | Lauer | G01B 9/02032 |
| | | | 359/22 |
| 2009/0041332 A1* | 2/2009 | Bhaskar | G01N 21/93 |
| | | | 382/145 |
| 2013/0148115 A1* | 6/2013 | Berlatzky | G01N 21/4788 |
| | | | 356/237.5 |
| 2014/0375981 A1 | 12/2014 | Wang et al. | |
| 2015/0022806 A1 | 1/2015 | Shibata et al. | |
| 2017/0045824 A1 | 2/2017 | Tanaka et al. | |
| 2017/0131528 A1* | 5/2017 | Ruoff | G02B 13/08 |
| 2018/0114732 A1* | 4/2018 | Bell | G01N 21/956 |
| 2018/0164693 A1 | 6/2018 | Petri et al. | |

* cited by examiner

INSPECTION SYSTEM WITH NON-CIRCULAR PUPIL

CROSS-REFERENCE TO RELATED APPLICATION

The present application claims the benefit under 35 U.S.C. § 119(e) of U.S. Provisional Application Ser. No. 62/793,027, filed Jan. 16, 2019, entitled INSPECTION SYSTEM WITH NON-CIRCULAR PUPIL, naming Damon Kvamme, Rui-fang Shi, Daniel Wack, Sseunhyeun Jo, and Xin Ye as inventors, which is incorporated herein by reference in the entirety.

TECHNICAL FIELD

The present disclosure relates generally to inspection systems and, more particularly, to inspection systems with extreme ultraviolet illumination.

BACKGROUND

Inspection systems provide critical quality control measurements in semiconductor fabrication and metrology and may generally be used to inspect various components such as, but not limited to, photomasks (e.g., reticles), unpatterned wafers, or patterned wafers. It is typically desirable for inspection systems to provide high-fidelity and low noise images to resolve defects of interest that may impact the fabrication process or performance of fabricated devices.

For example, photomask inspection systems may inspect photomasks with an illumination source having the same or a substantially similar spectrum to the light source used in a lithography system to fabricate features based on images of the photomasks in order to resolve defects that may impact integrated circuits fabricated from the masks. However, the demand for ever-smaller feature sizes is driving a corresponding decrease in the wavelengths used for both lithography and inspection systems. In particular, extreme ultraviolet (EUV) light typically used for lithography and inspection systems presents significant challenges for the design of both illumination sources (e.g., EUV sources) and inspection systems that typically impose tradeoffs between brightness of the illumination source, system cost, and complexity of the optical systems.

It may therefore be desirable to provide inspection systems and methods providing high fidelity images and efficient utilization of source illumination without imposing undue complexity and associated costs.

SUMMARY

An inspection system is disclosed in accordance with one or more illustrative embodiments of the present disclosure. In one illustrative embodiment, the system includes an illumination source to generate extreme ultraviolet (EUV) light. In another illustrative embodiment, the system includes illumination optics to direct the EUV light to a sample within a range of incidence angles corresponding to an illumination pupil distribution in a pupil plane of the one or more illumination optics, where a center of the illumination pupil distribution corresponds to an off-axis incidence angle along a first direction on the sample. In another illustrative embodiment, the system includes one or more collection optics to collect light from the sample in response to the incident EUV light within a range of collection angles corresponding to an imaging pupil distribution in a pupil plane of the one or more collection optics. In another illustrative embodiment, a center of the imaging pupil distribution corresponds to an off-axis collection angle along the first direction on the sample. In another illustrative embodiment, at least one of the illumination pupil distribution or the imaging pupil distribution is non-circular with a size along the first direction shorter than a size along a second direction perpendicular to the first direction. In another illustrative embodiment, the system includes a detector to receive at least a portion of the light collected by the one or more collection optics.

A photomask inspection system is disclosed in accordance with one or more illustrative embodiments of the present disclosure. In one illustrative embodiment, the system includes an illumination source to generate an illumination beam. In another illustrative embodiment, the system includes one or more illumination optics to direct the illumination beam to a photomask within a range of incidence angles corresponding to an illumination pupil distribution in a pupil plane of the one or more illumination optics, where a center of the illumination pupil distribution corresponds to an off-axis incidence angle along a first direction on the photomask. In another illustrative embodiment, the system includes one or more collection optics to collect light from the photomask in response to the incident illumination beam within a range of collection angles corresponding to an imaging pupil distribution in a pupil plane of the one or more collection optics. In another illustrative embodiment, a center of the imaging pupil distribution corresponds to an off-axis collection angle along the first direction on the photomask. In another illustrative embodiment, at least one of the illumination pupil distribution or the imaging pupil distribution is non-circular with a size along the first direction smaller than a size along a second direction perpendicular to the first direction. In another illustrative embodiment, the system includes a detector configured to receive at least a portion of the light collected by the one or more collection optics and generate one or more detection signals associated with the received light.

An inspection method is disclosed in accordance with one or more illustrative embodiments of the present disclosure. In one illustrative embodiment, the method includes directing extreme ultraviolet (EUV) light to a sample within a range of incidence angles corresponding to an illumination pupil distribution in a pupil plane of one or more illumination optics, where a center of the illumination pupil distribution corresponds to an off-axis incidence angle along a first direction on the sample. In another illustrative embodiment, the method includes collecting light from the sample in response to the incident EUV light within a range of collection angles corresponding to an imaging pupil distribution in a pupil plane of one or more collection optics. In another illustrative embodiment, a center of the imaging pupil distribution corresponds to an off-axis collection angle along the first direction on the sample. In another illustrative embodiment, at least one of the illumination pupil distribution or the imaging pupil distribution is non-circular with a size along a first direction shorter than a size along a second direction perpendicular to the first direction. In another illustrative embodiment, the method includes generating, with a detector, an image of the sample based on at least a portion of the light collected by the one or more collection optics.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to inspection systems and methods incorporating off-axis illumination and/or collection with a non-circular distribution in at least one of an illumination pupil or an imaging pupil, where a spatial extent (e.g., a size) of the non-circular distribution is smaller in directions in the plane of incidence than directions out of the plane of incidence.

For example, an inspection system may generally illuminate a sample with a range of incidence angles corresponding to a numerical aperture of illumination optics and collect light from the sample within a range of collection angles corresponding to a numerical aperture of collection optics, which may or may not be the same as the illumination optics. The ranges of incident angles and collection angles correspond to distributions in an illumination pupil plane and an imaging pupil plane, respectively. An off-axis illumination system may thus be characterized as having a chief ray (or an approximate center) of an illumination and/or imaging pupil distribution at an off-axis angle with respect to a normal of the sample (e.g., a sample normal).

Additional embodiments of the present disclosure are directed to inspection using EUV light, which may include, but is not limited to, wavelengths below approximately 120 nanometers (nm). For example, EUV light sources for lithography and/or inspection may generate light centered around wavelengths such as, but not limited to, 13.5 nm, or 7 nm. It is recognized herein that inspection with EUV light introduces a variety of design considerations. For example, EUV systems typically include only reflective components, often arranged at glancing angles of incidence, due to the high absorption of EUV light by nearly all materials. EUV imaging systems may thus operate in a reflective mode in which imaged light includes reflected and/or scattered light from the sample. Further, EUV imaging systems may have non-overlapping illumination and imaging pupil distributions such that the range of incident angles of incident light may not overlap with the range of collected light used to image the sample, which may impose additional restraints as described in greater detail below.

It is recognized herein that inspection systems may typically be designed to provide circular illumination and imaging pupil distributions, which may provide constant image quality (e.g., resolution, signal strength, noise level, or the like) for all directions on the sample with a typical optical configuration. However, such a configuration in an off-axis inspection system may fail to utilize the full range of available numerical apertures and may ultimately limit the system performance.

Additional embodiments of the present disclosure are directed to illuminating a sample with a non-circular illumination pupil distribution, where a spatial extent of the non-circular illumination pupil is smaller in directions in a plane of incidence (e.g., defined by the sample normal and off-axis illumination and/or collected light) than in directions out of the plane of incidence. It is noted herein that size and shape of the illumination pupil distribution is typically designed to balance tradeoffs related to system performance. For example, decreasing the size of the illumination pupil distribution (related to the illumination etendue or throughput of illumination photons) may increase desirable defect signals as well as the undesirable impact of line-edge roughness. Further, it may be the case that sample reflectivity may decrease as the angle of incidence increases with respect to the sample normal such that it may be desirable to limit the numerical aperture of the illumination. Illuminating the sample with a non-circular illumination pupil may facilitate limiting the numerical aperture of illumination light along selected directions (e.g., in the plane of incidence), while maintaining a desired illumination etendue. In this regard, illumination with a non-circular illumination pupil may enable increased performance relative to illumination with a circular illumination pupil without requiring larger, more complex, or more costly optics.

Additional embodiments of the present disclosure are directed to collecting light from the sample with a non-circular imaging pupil distribution, where a spatial extent of the non-circular imaging pupil is smaller in directions within the plane of incidence than in directions out of the plane of incidence. For example, a non-circular aperture extending in directions perpendicular to the plane of incidence may capture additional scattered light from the sample relative to collection within a circular imaging pupil distribution without requiring larger, more complex, or more costly optics.

It is recognized herein that the resolution of an imaging system depends in part on the numerical aperture of collected light such that a non-circular imaging pupil distribution may lead to different resolutions along different directions. Further embodiments of the present disclosure are directed to providing uniform image resolution with a non-circular imaging pupil distribution. In some embodiments, one or more collection optics may provide anamorphic magnification onto a detector. In this regard, the magnification of the collected light may be different along different directions (e.g., directions in the plane of incidence and directions perpendicular to the plane of incidence) such that a typical detector having square pixels may uniformly sample the imaged light. In some embodiments, a detector may be designed with rectangular pixels. In this regard, the differing dimensions of the pixels may compensate for the numerical aperture variations associated with the non-circular imaging pupil distribution.

Figure 1:
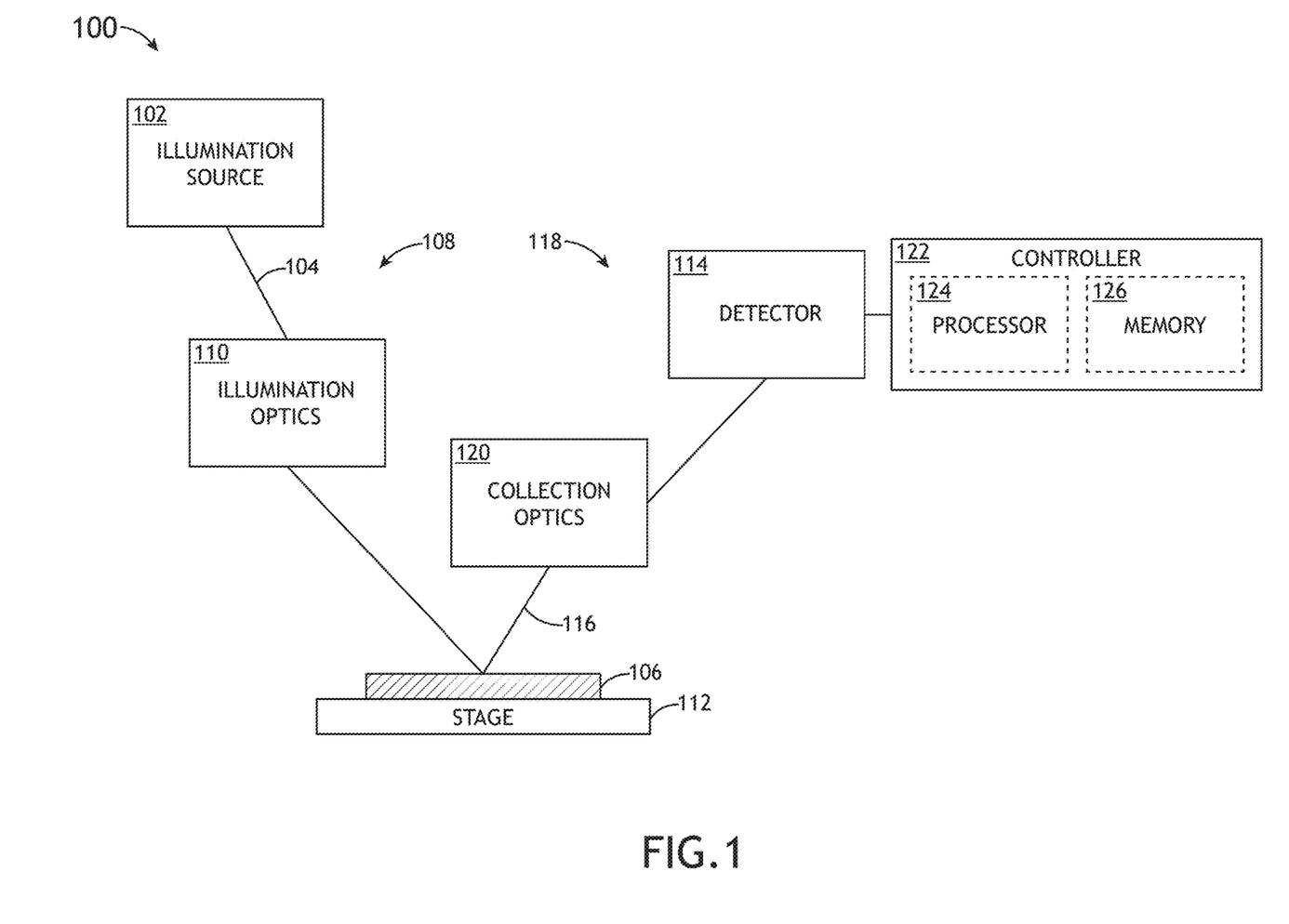
FIG. 1 is a conceptual view of an inspection system providing off-axis illumination and collection, in accordance with one or more embodiments of the present disclosure.

FIG. 1 is a conceptual view of an inspection system 100 providing off-axis illumination and collection, in accordance with one or more embodiments of the present disclosure.

In one embodiment, the inspection system 100 includes an illumination source 102 to generate an illumination beam 104. The illumination beam 104 may include one or more selected wavelengths of light including, but not limited to, ultraviolet (UV), extreme ultraviolet (EUV), deep ultraviolet (DUV), or vacuum ultraviolet (VUV) radiation. For example, at least a portion of a spectrum of the illumination beam 104 may include wavelengths below approximately 120 nanometers. By way of another example, at least a portion of a spectrum of the illumination beam 104 may include wavelengths associated with a lithography device suitable for semiconductor fabrication such as, but not limited to, 13.5 nm, 7 nm, or the like.

The illumination source 102 may be any type of illumination source known in the art suitable for generating an optical illumination beam 104. In one embodiment, the illumination source 102 includes a broadband plasma (BBP) illumination source. In this regard, the illumination beam 104 may include radiation emitted by a plasma. For example, a BBP illumination source 102 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 104.

In another embodiment, the illumination source 102 may include one or more lasers capable of emitting radiation at one or more selected wavelengths.

The illumination source 102 may further produce an illumination beam 104 having any temporal profile. For example, the illumination source 102 may produce a continuous illumination beam 104, a pulsed illumination beam 104, or a modulated illumination beam 104.

In another embodiment, the illumination source 102 directs the illumination beam 104 to a sample 106 via an illumination pathway 108. The illumination pathway 108 may include one or more illumination optics 110 suitable for directing, focusing, and/or shaping the illumination beam 104 on the sample 106. For example, the illumination optics 110 may include one or more lenses, one or more focusing elements, or the like. Further, the illumination optics 110 may include any combination of reflective, transmissive, or absorbing optical elements known in the art suitable for directing and/or focusing the illumination beam 104. For instance, the illumination optics 110 may include reflective optics suitable for directing and/or focusing low-wavelength light (e.g., EUV light, and the like) such as, but not limited to, flat mirrors or curved mirrors (e.g., elliptical mirrors, parabolic mirrors, or the like).

The illumination optics 110 may further include one or more additional illumination pathway components suitable for shaping the illumination beam 104 and/or controlling a range of incidence angles of the illumination beam 104 on the sample 106 (e.g., an illumination pupil distribution). For example, the illumination pathway components may include, but are not limited to, one or more apertures, one or more apodizers, one or more homogenizers, one or more diffusers, one or more polarizers, or one or more filters.

In another embodiment, the sample 106 is disposed on a sample stage 112. The sample stage 112 may include any device suitable for positioning and/or scanning the sample 106 within the inspection system 100. For example, the sample stage 112 may include any combination of linear translation stages, rotational stages, tip/tilt stages, or the like.

In another embodiment, the inspection system 100 includes a detector 114 configured to capture light emanating from the sample 106 (e.g., collected light 116) through a collection pathway 118. The collection pathway 118 may include, but is not limited to, one or more collection optics 120 for collecting radiation from the sample 106. For example, a detector 114 may receive collected light 116 reflected or scattered (e.g., via specular reflection, diffuse reflection, and the like) from the sample 106 via the collection optics 120. By way of another example, a detector 114 may receive collected light 116 generated by the sample 106 (e.g., luminescence associated with absorption of the illumination beam 104, or the like) in response to the illumination beam 104. The collection optics 120 may include any combination of reflective, transmissive, or absorbing optical elements known in the art suitable for directing and/or focusing the collected light 116. For instance, the illumination optics 110 may include reflective optics suitable for directing and/or focusing low-wavelength light (e.g., EUV light, and the like) such as, but not limited to, flat mirrors or curved mirrors (e.g., elliptical mirrors, parabolic mirrors, or the like).

The detector 114 may include any type of detector known in the art suitable for measuring collected light 116 received from the sample 106. For example, a detector 114 may include, but is not limited to, a CCD detector, a TDI detector, a photomultiplier tube (PMT), an avalanche photodiode (APD), or the like. In another embodiment, a detector 114 may include a spectroscopic detector suitable for identifying wavelengths of radiation emanating from the sample 106.

The collection pathway 118 may further include any number of additional collection pathway components to direct and/or shape the collected light 116 from the sample 106 including, but not limited to, one or more apertures, one or more apodizers, one or more polarizers, or one or more filters. In one embodiment, the collection pathway components provide a range of angles within which light is collected from the sample 106 (e.g., an imaging pupil distribution).

In another embodiment, the inspection system 100 includes a controller 122. In another embodiment, the controller 122 includes one or more processors 124 configured to execute program instructions maintained on a memory medium 126 (e.g., memory). In this regard, the one or more processors 124 of controller 122 may execute any of the various process steps described throughout the present disclosure.

The one or more processors 124 of a controller 122 may include any processing element known in the art. In this sense, the one or more processors 124 may include any microprocessor-type device configured to execute algorithms and/or instructions. In one embodiment, the one or more processors 124 may consist of a desktop computer, mainframe computer system, workstation, image computer, parallel processor, or any other computer system (e.g., networked computer) configured to execute a program configured to operate the inspection system 100, as described throughout the present disclosure. It is further recognized that the term "processor" may be broadly defined to encompass any device having one or more processing elements, which execute program instructions from a non-transitory memory medium 126.

The memory medium 126 may include any storage medium known in the art suitable for storing program instructions executable by the associated one or more processors 124. For example, the memory medium 126 may include a non-transitory memory medium. By way of another example, the memory medium 126 may include, but is not limited to, a read-only memory, a random access memory, a magnetic or optical memory device (e.g., disk), a magnetic tape, a solid state drive and the like. It is further noted that memory medium 126 may be housed in a common controller housing with the one or more processors 124. In one embodiment, the memory medium 126 may be located remotely with respect to the physical location of the one or more processors 124 and controller 122. For instance, the one or more processors 124 of controller 122 may access a remote memory (e.g., server), accessible through a network (e.g., internet, intranet and the like). Therefore, the above description should not be interpreted as a limitation on the present invention but merely an illustration.

The controller 122 may be communicatively coupled with any component of the inspection system 100 or any additional components outside of the inspection system 100. In one embodiment, the controller 122 may be configured to receive data from a component such as, but not limited to, the detector 114. For example, the controller 122 may receive any combination of raw data, processed data (e.g., inspection results), and/or partially-processed data. In another embodiment, the controller 122 may perform processing steps based on the received data. For example, the controller 122 may perform defect inspection steps such as, but not limited to, defect identification, classification, or sorting.

Further, the steps described throughout the present disclosure may be carried out by a single controller 122 or, alternatively, multiple controllers. Additionally, the controller 122 may include one or more controllers housed in a common housing or within multiple housings. In this way, any controller or combination of controllers may be separately packaged as a module suitable for integration into the inspection system 100. For instance, the controller 122 may operate as a centralized processing platform. In another instance, the controller 122 may be distributed such that portions of the controller 122 may be implemented in and/or housed in any combination of the inspection tools.

In another embodiment, the controller 122 may control and/or direct (e.g., via control signals) any component of the inspection system 100. For example, any combination of elements of the illumination pathway 108 and/or the collection pathway 118 may be adjustable. In this regard, the controller 122 may modify any combination of illumination conditions or imaging conditions such as, but not limited to, the illumination or imaging pupil distributions.

The inspection system 100 may be configured as any type of inspection known in the art. Further, the inspection system 100 may be, but is not required to be, an EUV inspection system 100 suitable for interrogating a sample 106 with EUV light. In one embodiment, the inspection system 100 is a photomask inspection system. Accordingly, a sample 106 interrogated by the inspection system may include a photomask (e.g., a reticle). In another embodiment, the inspection system 100 is configured as an EUV mask blank inspection system. EUV-based mask blank inspection is described generally in U.S. Pat. No. 8,711,346 to Stokowski, issued on Apr. 29, 2014, and U.S. Pat. No. 8,785,082 to Xiong et al., issued on Jul. 22, 2014, both of which are incorporated herein by reference in the entirety. In another embodiment, the inspection system 100 is configured as a wafer inspection system or a reticle inspection system. EUV Imaging is described generally in U.S. Pat. No. 8,842,272 to Wack, issued on Sep. 23, 2014, which is incorporated herein by reference in the entirety.

Figure 2:
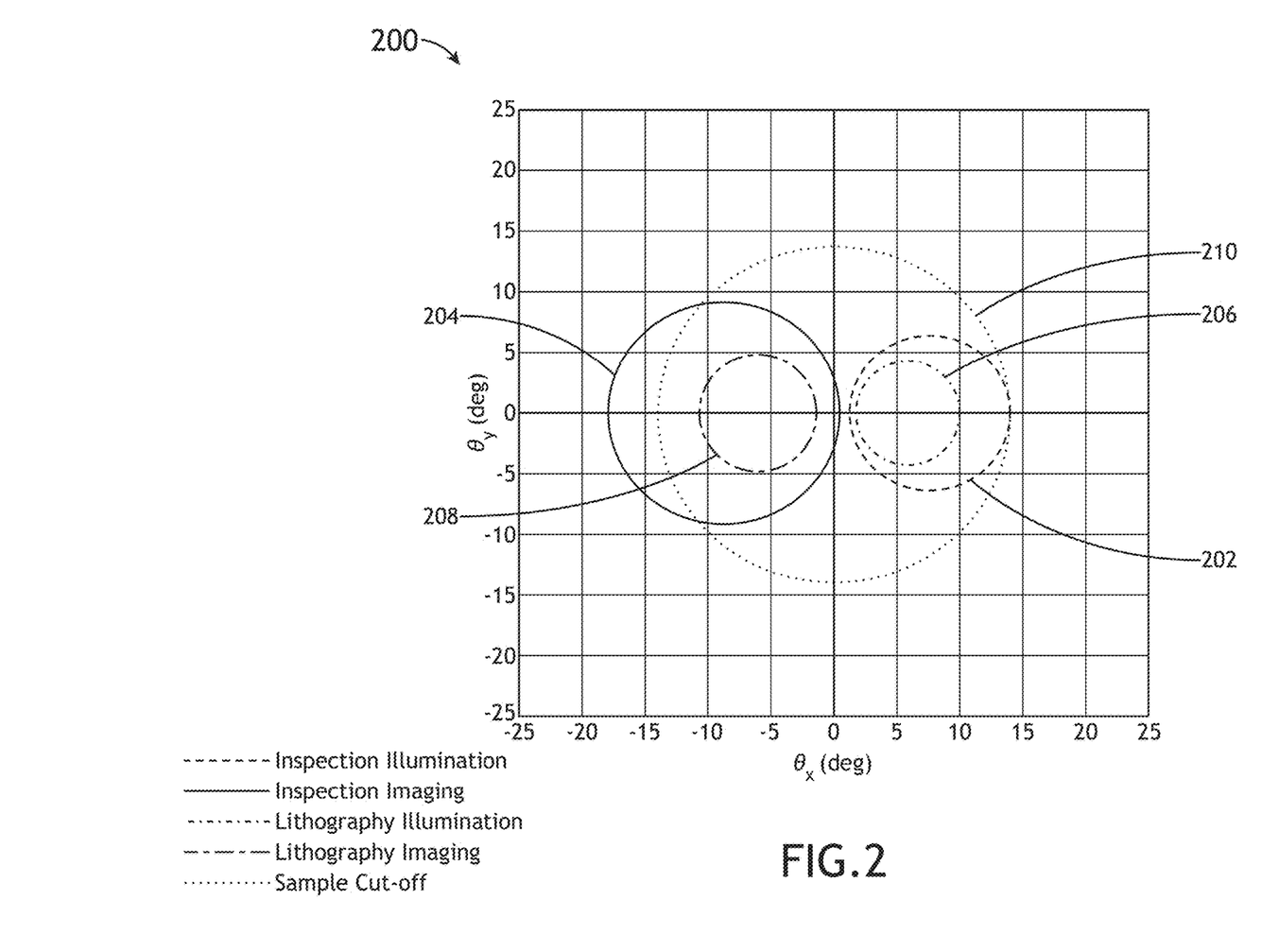
FIG. 2 is a plot of circular illumination and imaging pupil distributions for inspection and lithography, in accordance with one or more embodiments of the present disclosure.
Figure 3:
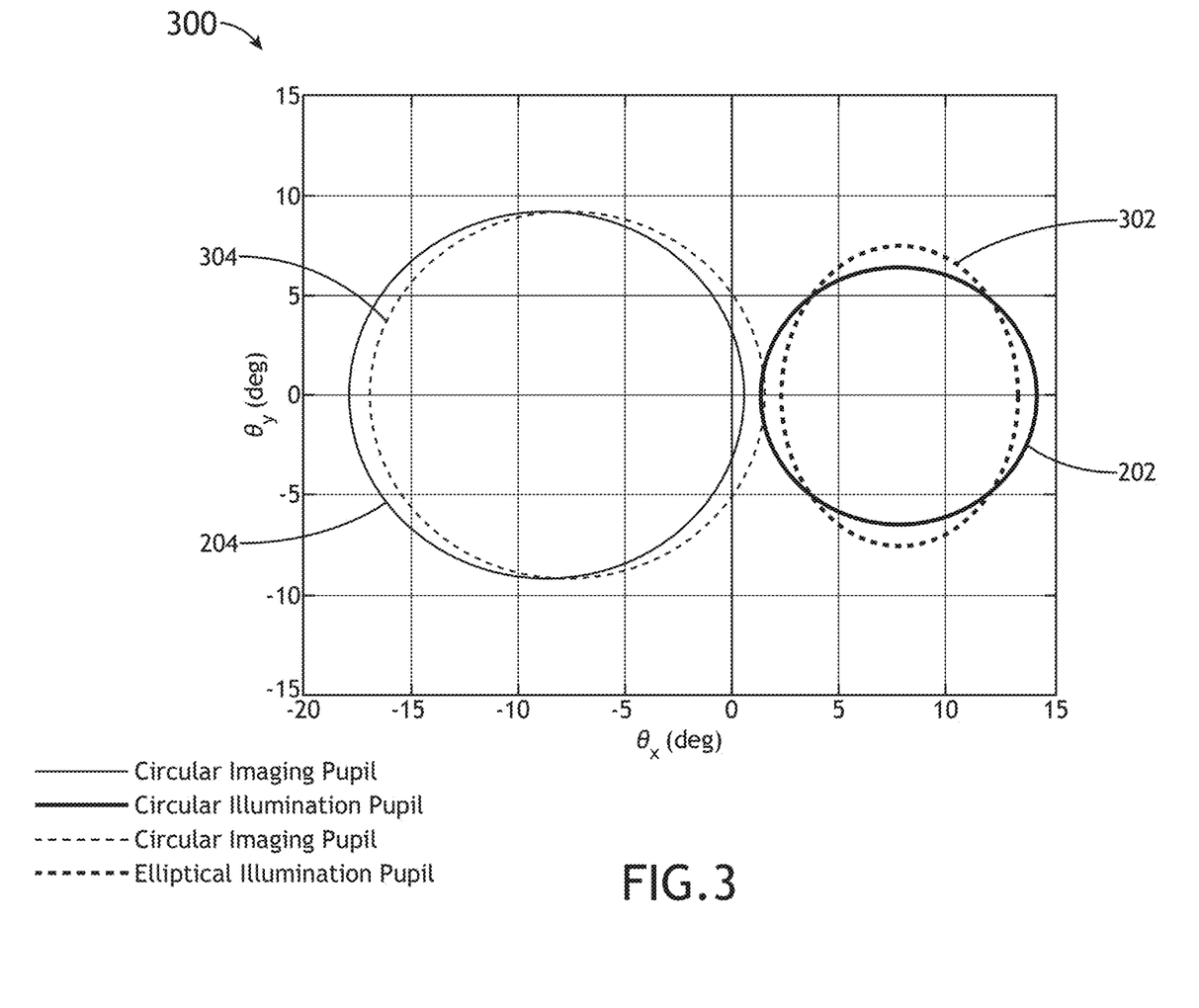
FIG. 3 is a plot illustrating two illumination pupil distributions for inspection with different shapes, in accordance with one or more embodiments of the present disclosure.
Figure 4:
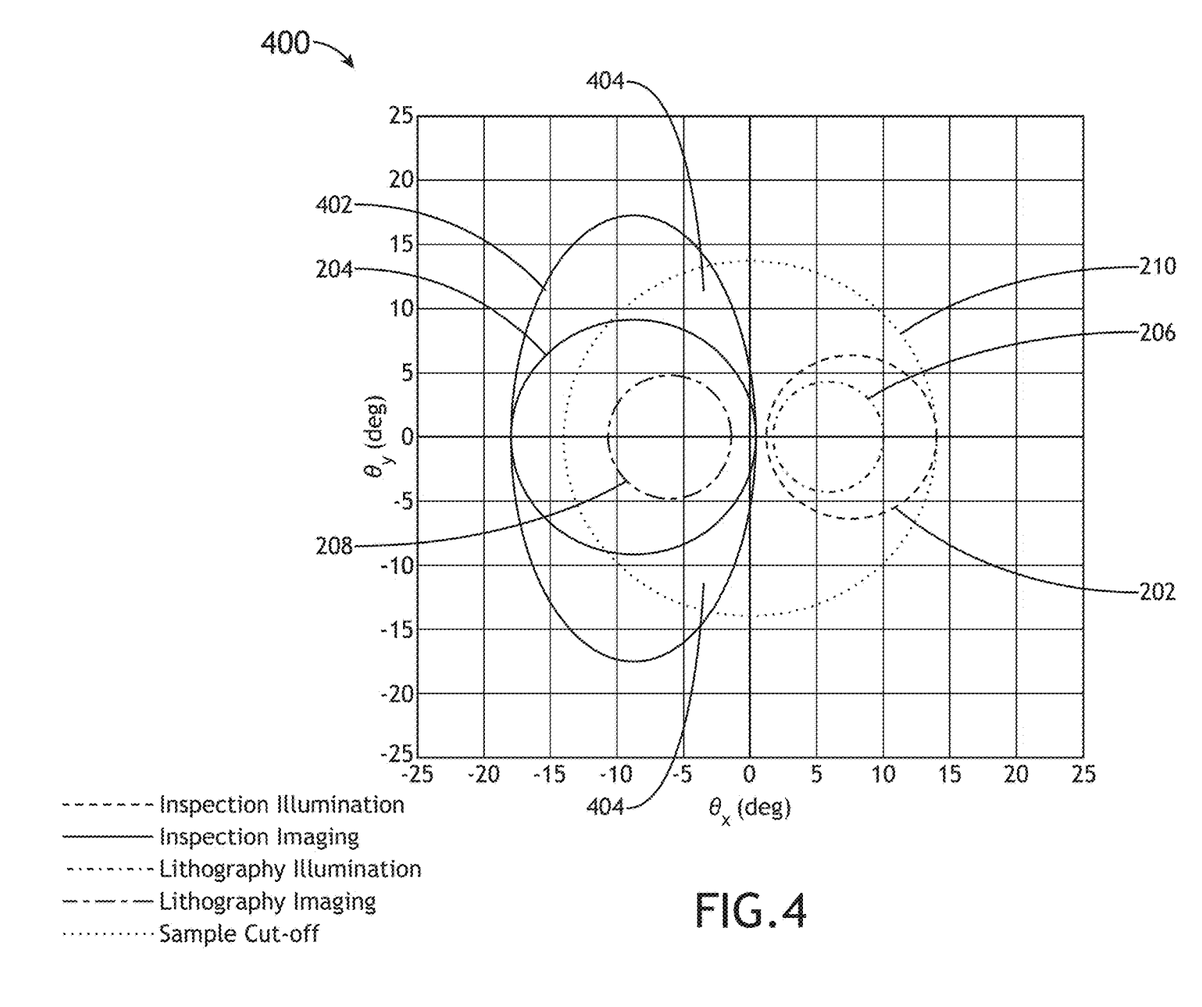
FIG. 4 is a plot illustrating imaging pupil distributions for inspection with different shapes, in accordance with one or more embodiments of the present disclosure.

Referring now to FIGS. 2 through 4, circular and non-circular pupil distributions for illumination and collected light (e.g., illumination and imaging pupil distributions) are described in greater detail. The illumination and/or imaging pupil distributions of FIGS. 2 through 4 may be implemented by an inspection system such as, but not limited to, the inspection system 100 illustrated in FIG. 1. Further, the illumination and/or imaging pupil distributions of FIGS. 2 through 4 may be, but are not required to be, suitable for EUV inspection.

It is recognized herein that photomask inspection and lithography with a photomask may be, but is not required to be, performed by different illumination and/or imaging pupil distributions. For example, selection of a central point (e.g., corresponding to a chief ray angle), a size, and/or a shape of a pupil distribution may incorporate tradeoffs between throughput (e.g., etendue), coherence, and the like that may differ for different applications. Further, an illumination pupil distribution and an imaging pupil distribution associated with the same application (e.g., inspection, lithography, or the like) may or may not have the same characteristics (e.g., a size and/or shape of a pupil distribution).

It is further recognized herein that the numerical aperture (e.g., a largest angle of incident or collected light) of an inspection system and/or a lithography system may typically be limited. For example, the numerical aperture of the inspection system may be limited by physical sizes or focusing powers of system components (e.g., illumination optics 110, collection optics 120, or the like). By way of another example, the reflectivity of the sample 106 (or a coating on the sample 106) may vary as a function of angle such that illumination and/or collection beyond a cut-off angle may be inefficient and/or impractical.

Further, it may be desirable that an illumination pupil distribution associated with an inspection system lie within a cut-off angle associated with a sample 106 to ensure efficient utilization of light (e.g., the illumination beam 104). However, it may be the case that the imaging pupil distribution may be more flexibly designed than the illumination pupil distribution. For example, illumination outside the cutoff angle may be inefficiently utilized. However, the imaging pupil distribution may include both reflected light (e.g., light at an equal, but opposite angle as incident light) and scattered light, which may emanate from the sample 106 at a wide range of angles. Accordingly, extending an imaging pupil distribution corresponding to angles beyond those of reflected light may increase the captured light signal and may increase the signal to noise ratio of a generated image. Further, the imaging pupil distribution may generally extend beyond the cut-off angle associated with the sample 106 without decreasing performance.

FIG. 2 is a plot 200 of circular illumination and imaging pupil distributions for inspection and lithography of a sample 106 (e.g., a photomask), in accordance with one or more embodiments of the present disclosure. In FIG. 2, an angle of 0 represents a surface normal associated with the photomask, distance from 0 represents the angle of incidence and/or collection with respect to the surface normal, and $\theta_x$, $\theta_y$ represent azimuthal angles with respect to the photomask. Further, $\theta_x$ and $\theta_y$ may correspond to X and Y directions, respectively, in a sample plane (e.g., a surface of the sample 106, a plane perpendicular to the surface normal, or the like). In particular, FIG. 2 includes an illumination pupil distribution 202 and an imaging pupil distribution 204 for inspection (e.g., with the inspection system 100) as well as an illumination pupil distribution 206 and an imaging pupil distribution 208 for lithography. In this regard, FIG. 2 illustrates the light cones associated with incident illumination and collected light used for imaging of a photomask in both inspection and lithography configurations. Further, FIG. 2 illustrates a photomask coating cut-off angle 210 of approximately 14 degrees, represented as a circle centered around an angle of 0 (the surface normal).

FIGS. 2 through 4 generally illustrate off-axis illumination and imaging of the sample 106 along the $\theta_X$ direction. As described previously herein, it may be useful to characterize the off-axis illumination and imaging of the sample with respect to a plane of incidence. For example, a plane of incidence may be defined by the surface normal and a central ray of incident and/or collected light. It is recognized herein that for practical systems in which incident and/or collected light is represented as a cone (e.g., associated with a range of numerical apertures), a plane of incidence may be defined for each ray within the cone. However, for the purposes of clarity in the present disclosure, a plane of incidence (e.g., an interaction plane) may be defined based on a central ray associated with the illumination beam 104 for any application (e.g., inspection, lithography, or the like). For instance, a plane of incidence associated with FIGS. 2 through 4 may be considered as a plane formed by the surface normal and the $\theta_X$ direction in angular space (or the X-direction on the sample 106). Further, as illustrated in FIGS. 2 through 4, the imaging pupil distribution 204 for inspection may be, but is not required to be, centered in the plane of incidence.

It is further recognized herein that a distribution of a beam (e.g., the illumination beam 104) may typically not be represented as a step function, but may generally have tails. Additionally, a beam may include "hot spots" or irregularities. A center of an illumination and/or imaging pupil distribution may thus be determined by any technique known in the art. For example, a center of a pupil distribution may be determined based on, but not limited to, a location of an intensity peak, or a weighted intensity analysis.

In FIGS. 2 and 4, the illumination pupil distribution 206 and the imaging pupil distribution 208 for lithography are circular distributions (e.g., representing circular cones of illumination and/or collection of light). Further, the illumination pupil distribution 206 has a diameter of approximately 8 degrees and is centered at approximately +6 degrees along the $\theta_X$ direction, while the imaging pupil distribution 208 has a diameter of approximately 9 degrees and is centered at approximately −6 degrees the $\theta_X$ direction. In this regard, the illumination pupil distribution 206 and the imaging pupil distribution 208 for lithography may represent approximately symmetric off-axis illumination and collection of light along the $\theta_X$ direction, where the imaging pupil distribution is slightly larger than the illumination pupil distribution. Further, in this example, both the illumination pupil distribution 206 and the imaging pupil distribution 208 for lithography lie within the cut-off angle 210 of the photomask.

It is to be understood, however, that characteristics of the illumination pupil distribution 206 and the imaging pupil distribution 208 for lithography such as, but not limited to, the sizes, shapes, orientations, and positions of the distributions are provided solely for illustrative purposes and should not be interpreted as limiting. Further, the illumination pupil distribution 206 need not have the same size, shape, orientation, or the like as the imaging pupil distribution 208 for lithography.

Referring again to FIG. 2, the illumination pupil distribution 202 and/or the imaging pupil distribution 204 associated with inspection of a sample 106 may also be circular such that the cones of illumination and/or collected light may be circular. In one embodiment, as illustrated in FIG. 2, the illumination pupil distribution 202 has a center point (e.g., corresponding to a chief ray angle) at approximately 7.5 degrees along the $\theta_X$ direction and a diameter of approximately 13 degrees such that the illumination pupil distribution 202 for inspection lies along an edge of, but is fully within, the cut-off angle 210. In another embodiment, as further illustrated in FIG. 2, the imaging pupil distribution 204 for inspection has a center point (e.g., corresponding to a chief ray angle) at approximately −9 degrees along the $\theta_X$ direction and a diameter of approximately 19 degrees. Accordingly, the imaging pupil distribution 204 for inspection may extend partially beyond the cut-off angle 210. As described previously herein, the imaging pupil distribution 204 for inspection may have a larger size than the illumination pupil distribution 202 for inspection to capture scattered light from the photomask in addition to reflected light.

Referring now to FIGS. 3 and 4, non-circular illumination and imaging pupil distributions, respectively, are described in greater detail.

FIG. 3 is a plot 300 illustrating two illumination pupil distributions for inspection with different shapes, in accordance with one or more embodiments of the present disclosure. For example, FIG. 3 includes a non-circular illumination pupil distribution 302 as well as the illumination pupil distribution 202 for inspection and the imaging pupil distribution 204 for inspection illustrated in FIG. 2.

A non-circular illumination pupil distribution such as, but not limited to, the non-circular illumination pupil distribution 302 of FIG. 3, may facilitate flexible design of the inspection system 100 that may provide increased sensitivity and/or throughput relative to a circular illumination pupil distribution without increasing the size, complexity and/or cost of optical components. For example, illumination optics 110 may include one or more optical elements (e.g., mirrors, focusing elements, or the like) configured in an off-axis configuration such that the illumination beam 104 is not incident at a normal incidence angle. The illumination optics 110 may thus be sized to accommodate the projected size of the illumination beam 104 based on the angle of incidence of each element. Further, many optical components are fabricated with circular dimensions for manufacturing and/or cost considerations. Accordingly, it may be the case that shaping portions of the illumination beam 104 along a direction perpendicular to a plane of incidence to provide a non-circular illumination pupil distribution 302 a direction perpendicular to a plane of incidence may utilize otherwise unused area on one or more illumination optics 110.

Further, a non-circular illumination pupil distribution 302 that extends further in directions outside the plane of incidence on the photomask (e.g., along the $\theta_Y$ direction) than in a direction within the plane of incidence (e.g., along the $\theta_X$ direction) may facilitate modification of the size, location, or shape of the imaging pupil distribution without increasing the size, complexity, and/or cost of optical components.

For example, as illustrated in FIG. 3, the non-circular illumination pupil distribution 302 may reduce the numerical aperture along the $\theta_X$ direction while maintaining a consistent etendue or throughput of the illumination beam 104 by extending along the $\theta_Y$ direction. This reduction of numerical aperture along the $\theta_X$ direction may allow for the position of the imaging pupil distribution 204 for inspection to be shifted towards the surface normal as indicated by a shifted imaging pupil distribution 304 in FIG. 3. Accordingly, the shifted imaging pupil distribution 304 may provide increased performance in applications where reflectivity of the photomask (or a sample 106 more generally) increases for angles near normal incidence. Further, though not shown, size of the shifted imaging pupil distribution 304 may be increased to collect additional light from the sample (e.g., scattered light).

By way of another example, though not shown, a size of a non-circular illumination pupil distribution, and thus the associated etendue, may be increased without increasing the size, complexity, and/or cost of the inspection system 100.

FIG. 4 is a plot 400 illustrating imaging pupil distributions for inspection with different shapes, in accordance with one or more embodiments of the present disclosure. In particular, FIG. 4 includes a non-circular imaging pupil distribution 402 as well as the illumination pupil distribution 206 for lithography and imaging pupil distribution 204 illustrated for inspection in FIG. 2.

A non-circular imaging pupil distribution such as, but not limited to, the non-circular imaging pupil distribution 402 of FIG. 4, may facilitate flexible design of the inspection system 100 that may provide increased sensitivity and/or throughput relative to a circular imaging pupil distribution without increasing the size, complexity and/or cost of optical components. For example, collection optics 120 may include one or more optical elements (e.g., mirrors, focusing elements, or the like) configured in an off-axis configuration such that the collected light 116 is not incident at a normal incidence angle. The collection optics 120 may thus be sized to accommodate the projected size of the collected light 116 based on the range of angles at which light is collected from the sample. Further, many optical components are fabricated with circular dimensions for manufacturing and/or cost considerations. Accordingly, it may be the case that shaping portions of the collected light 116 along a direction perpendicular to a plane of incidence to provide a non-circular imaging pupil distribution 402 may utilize otherwise unused area on one or more collection optics 120.

For example, the non-circular imaging pupil distribution 402 may extend further along the $\theta_Y$ direction than along the $\theta_X$ direction in order to capture additional light (e.g., scattered light) from the sample 106 without requiring additional size or complexity (and associated costs) than the imaging pupil distribution 204 for inspection. For instance, scattered light may be collected (e.g., as the collected light 116) in regions 404 illustrated in FIG. 4. In another embodiment, though not shown, a non-circular imaging pupil distribution may be sized along the $\theta_X$ direction to not exceed the cut-off angle 210.

Further, as described previously herein, a non-circular imaging pupil distribution may be combined with a non-circular illumination pupil distribution (e.g., non-circular illumination pupil distribution 302). In this regard, the benefits of non-circular distribution for both illumination and imaging may be combined. For example, the non-circular illumination pupil distribution 302 of FIG. 3 may be combined with the non-circular imaging pupil distribution 402 of FIG. 4. Further, though not shown, the non-circular imaging pupil distribution 402 may be shifted along the $\theta_X$ (e.g., as described with respect to the imaging pupil distribution 304) to increase collected light 116 emanating from the sample 106 near the surface normal.

A non-circular pupil distribution may generally have any non-circular shape. For example, the non-circular illumination pupil distribution 302 and the non-circular imaging pupil distribution 402 in FIGS. 3 and 4, respectively, are illustrated as having elliptical shapes with major axes along the $\theta_Y$ direction (e.g., perpendicular to the plane of incidence including the surface normal and a ray at a center of the illumination pupil distribution). In some embodiments, the non-circular illumination pupil distribution 302 and/or the non-circular imaging pupil distribution 402 may have an arbitrary non-circular shape.

Further, a non-circular pupil distribution may be formed using any combination of components of an inspection system 100 such as, but not limited to, one or more apertures. For example, a non-circular illumination pupil distribution (e.g., the non-circular illumination pupil distribution 302 in FIG. 3) may be formed by one or more apertures in the illumination pathway 108. By way of another example, a non-circular imaging pupil distribution (e.g., the non-circular imaging pupil distribution 402 in FIG. 3) may be formed by one or more apertures in the collection pathway 118.

It is recognized herein that the resolution of an imaging system depends in part on the numerical aperture of the collected light 116. In this regard, a non-circular imaging pupil distribution (e.g., the non-circular illumination pupil distribution 302 in FIG. 3) may lead to a different resolution along the $\theta_X$ direction relative to the $\theta_Y$ direction. For example, a resolution of an image generated with the inspection system 100 along a particular direction (e.g., a sampling resolution) may be based on factors such as, but not limited to, the numerical aperture of the collected light 116 along that direction, the magnification along that direction, or the size of pixels of the detector 114 along that direction.

In some embodiments, an inspection system 100 provides at least one of a non-circular illumination pupil distribution or a non-circular imaging pupil distribution and further provides a constant (or approximately constant) resolution for multiple directions (e.g., the $\theta_X$ and $\theta_Y$ directions).

In one embodiment, the detector 114 of the inspection system 100 includes rectangular pixels having different lengths along two orthogonal directions to provide a uniform image resolution along the two directions. In this regard, the differences in pixel length along the two orthogonal directions may compensate for differences in numerical aperture and/or magnification associated with a non-circular imaging pupil.

Figure 5A:
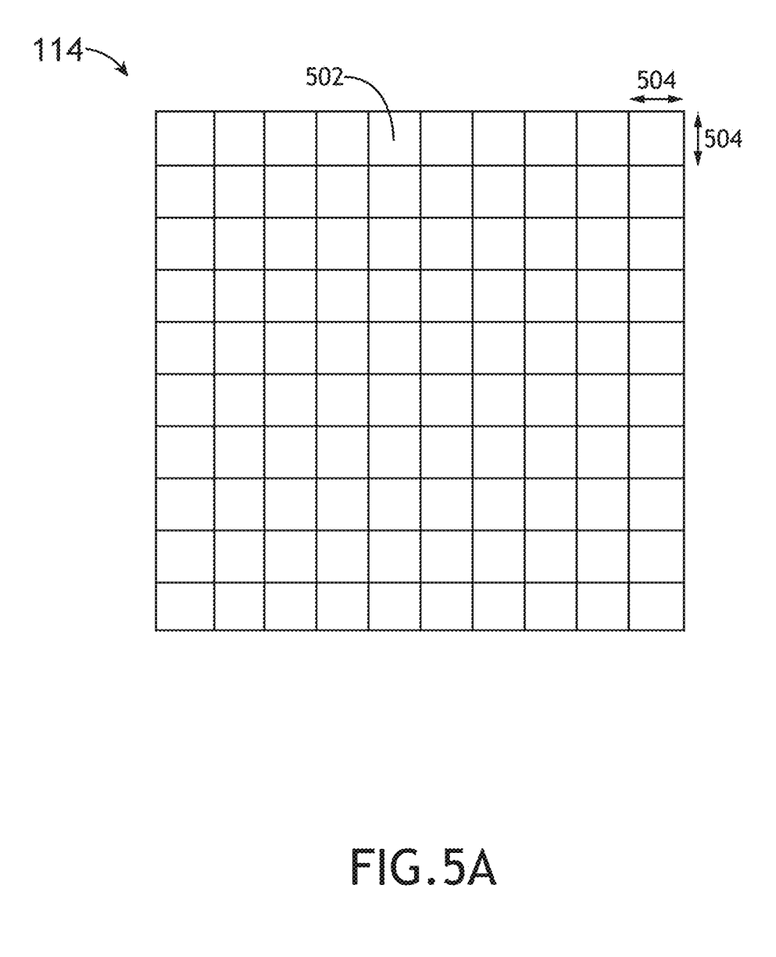
FIG. 5A includes a conceptual top view of a detector having square pixels.
Figure 5B:
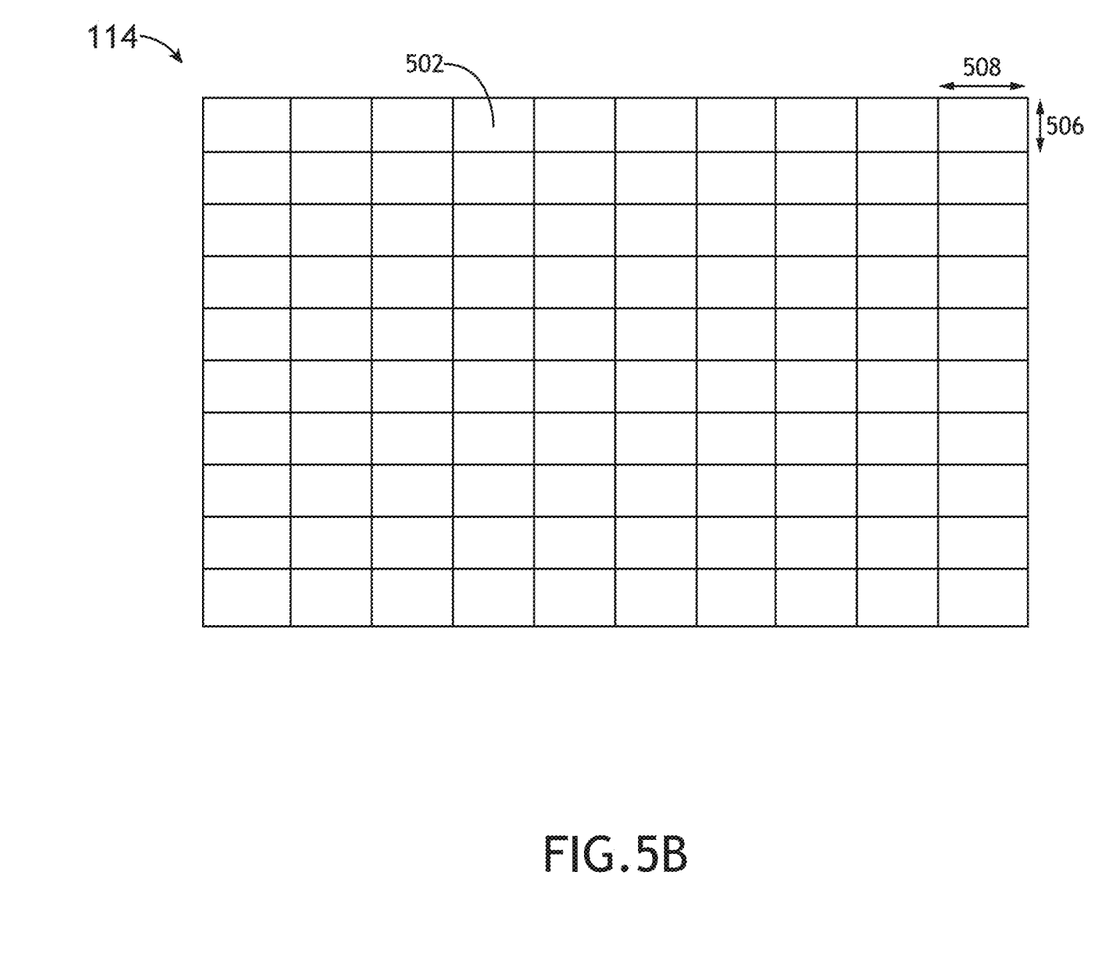
FIG. 5B includes a conceptual top view of a detector having rectangular pixels.

FIGS. 5A and 5B include conceptual top views of a detector 114 having square and rectangular pixels, respectively. For example, as illustrated in FIG. 5A, a detector 114 may include square pixels 502 of a uniform length 504 along two orthogonal directions. By way of another example, as illustrated in FIG. 5B, a detector 114 may include rectangular pixels 502 having a short length 506 and a long length 508.

In one embodiment, the inspection system 100 includes a non-circular imaging pupil that is more extended in directions outside a plane of incidence than in the plane of incidence (e.g., the non-circular imaging pupil distribution 402 illustrated in FIG. 4) and a detector 114 having rectangular pixels 502 as illustrated in FIG. 5B. For example, the plane of incidence associated with FIGS. 2-4 may be defined by the surface normal (0 angle) and the $\theta_X$ direction. Further, the pixels 502 of the detector 114 may be oriented with the short length 506 along the $\theta_Y$ direction and the long length along the $\theta_X$ direction. Additionally, the size of the non-circular imaging pupil distribution 402 and the size of the pixels 502 (e.g., the short length 506 and/or the long length 508) may be co-optimized to provide constant sampling along both the $\theta_X$ direction and the $\theta_Y$ direction. For instance, the size of the non-circular imaging pupil distribution 402 along the $\theta_X$ direction and the $\theta_Y$ direction may be controlled based on known pixel dimensions (e.g., the short length 506 and/or the long length 508) to provide the constant sampling for collected light 116 along both the $\theta_X$ direction and the $\theta_Y$ directions.

In one embodiment, the collection pathway 118 of the inspection system 100 may provide anamorphic magnification. For example, a magnification along the $\theta_X$ direction may be different than a magnification along the $\theta_Y$ direction. In this regard, the magnification along the $\theta_X$ and/or the $\theta_Y$ direction may be scaled to provide a constant image resolution (e.g., sampling resolution) for collected light 116 along both the $\theta_X$ direction and the $\theta_Y$ direction based on known pixel dimensions (e.g., the short length 506 and/or the long length 508).

Further, an inspection system 100 providing anamorphic magnification may utilize any type of detector 114 having pixels with any size or shape. In one embodiment, the inspection system 100 includes a non-circular imaging pupil that is more extended in directions outside a plane of incidence than in the plane of incidence (e.g., the non-circular imaging pupil distribution 402 illustrated in FIG. 4), a detector 114 having square pixels 502 as illustrated in FIG. 5A, and collection optics 120 providing anamorphic magnification.

The inspection system 100 (e.g., the collection optics 120, the detector 114, and the like) may sample the collected light 116 at any resolution. In one embodiment, the inspection system 100 provides a selected sampling resolution with respect to the point spread function (PSF) of the collection optics 120. For example, the size of the pixels 502 on the detector 114 and the magnification provided by the collection optics 120 may be co-optimized to provide a selected number of pixels with respect to a size of the PSF. It is recognized herein that the sampling resolution with respect to the PSF may represent a balance between design tradeoffs in an inspection system. In this regard, a selected sampling resolution providing a selected balance may provide critical sampling. For example, increasing the sampling resolution may generally improve image quality (e.g., image fidelity), but may also increase the sampling time and thus the operational throughput. Further, increasing the sampling resolution may require increased magnification, which may result in aberrations and/or increased complexity and cost of the collection optics 120. In one embodiment, the inspection system 100 provides approximately 4.88 pixels 502 across the PSF of the collection optics 120, which may be considered to be critical sampling. However, it is to be understood that the value of 4.88 is provided solely for illustrative purposes and should not be interpreted as limiting. In a general sense, the inspection system 100 may provide any sampling resolution associated with any selected level of performance.

Further, it may be the case that the PSF may not be circular and may have different sizes along different directions (e.g., corresponding to the $\theta_X$ and $\theta_Y$ directions, the X and Y directions on the sample, or the like). In this regard, the range of numerical apertures, the magnification, and the size of pixels 502 along the different directions may be separately selected to provide the selected level of performance.

It is recognized herein that an inspection system 100 including a non-circular imaging pupil and constant resolution across multiple directions (e.g., obtained with any combination of anamorphic magnification and square pixels 502 or rectangular pixels 502) may operate in the same or substantially the same manner as an inspection system 100 including a circular imaging pupil. For example, image analysis and/or processing of the resulting images may be performed using the same or substantially the same techniques with little or no modification. Accordingly, the benefits of the non-circular imaging pupil as described herein may be obtained without significant increases in size, complexity, or cost.

It is further recognized herein that non-circular pupils for illumination and/or imaging may be suitable for inspection of a wide range of defect types oriented in any direction on the sample 106.

For example, models of the defect sensitivity associated with defects of various types of defects were generated using approximately elliptical imaging pupil distributions with increasing ratios of numerical apertures outside the plane of incidence relative to within the plane of incidence (e.g., $NA_{\theta Y}/NA_{\theta X}$ using directions defined in FIGS. 2 through 4). Further, all models were generated using a common system in which only the imaging pupil distributions were modified (e.g., the illumination pupil distributions remained constant). For structures along the Y-direction on the sample 106 (associated with the $\theta_y$ of the inspection system 100), a numerical aperture ratio of 1.25 provided an approximately 19% increase in inspection sensitivity, a numerical aperture ratio of 1.5 provided an approximately 32% increase in inspection sensitivity, and a numerical aperture ratio of 2 provided an approximately 48% increase in inspection sensitivity. For structures along the X-direction on the sample 106 (associated with the $\theta_X$ of the inspection system 100), a numerical aperture ratio of 1.25 provided an approximately 12% increase in inspection sensitivity, a numerical aperture ratio of 1.5 provided an approximately 20% increase in inspection sensitivity, and a numerical aperture ratio of 2 provided an approximately 27% increase in inspection sensitivity. For round defects, a numerical aperture ratio of 1.25 provided an approximately 19% increase in inspection sensitivity, a numerical aperture ratio of 1.5 provided an approximately 28% increase in inspection sensitivity, and a numerical aperture ratio of 2 provided an approximately 48% increase in inspection sensitivity.

By way of another example, models of the defect sensitivity associated with defects of various types of defects were generated using approximately elliptical illumination pupil distributions with a circular illumination pupil and an illumination pupil having a ratio $NA_{\theta Y}/NA_{\theta X}$ of approximately 1.37. Further, all models were generated using a common system in which only the illumination pupil distributions were modified (e.g., the imaging pupil distributions remained constant). For structures along the Y-direction on the sample 106 (associated with the $\theta_Y$ of the inspection system 100), a numerical aperture ratio of 1.37 provided an approximately 3.6% increase in inspection sensitivity. For structures along the X-direction on the sample 106 (associated with the $\theta_X$ of the inspection system 100), a numerical aperture ratio of 1.37 provided an approximately 0.4% increase in inspection sensitivity. For round defects, a numerical aperture ratio of 1.37 provided an approximately 1.4% increase in inspection sensitivity. Further, a numerical aperture ratio of 1.37 provided an approximately 10% increase in the average multilayer reflectivity.

Figure 6:
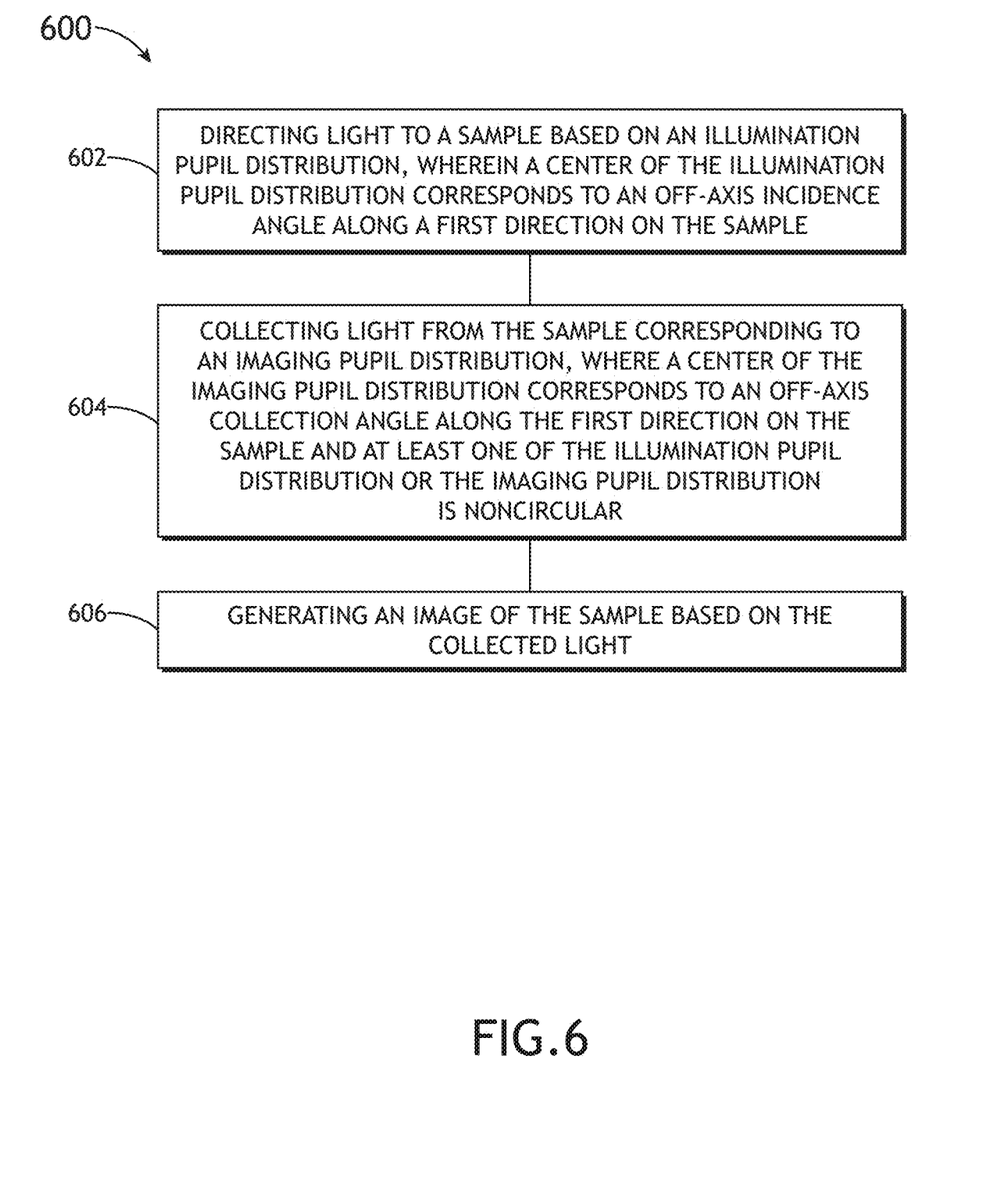
FIG. 6 is a flow diagram illustrating steps performed in a method for inspecting a sample.

FIG. 6 is a flow diagram illustrating steps performed in a method 600 for inspecting a sample. Applicant notes that the embodiments and enabling technologies described previously herein in the context of the inspection system 100 should be interpreted to extend to the method 600. It is further noted, however, that the method 600 is not limited to the architecture of the inspection system 100.

In one embodiment, the method 600 includes a step 602 of directing light to a sample based on an illumination pupil distribution, where a center of the illumination pupil distribution corresponds to an off-axis incidence angle along a first direction on the sample (e.g., an X direction on the sample corresponding to $\theta_X$ illustrated in FIGS. 2 through 4). In this regard, the illumination pupil distribution may correspond to a range of incident angles of the incident light.

The light directed to the sample may have any selected spectrum including any selected wavelength or range of wavelengths. In one embodiment, the light directed to the sample includes at least a portion of EUV light. Accordingly, directing the EUV light to the sample may incorporate optical components (e.g., mirrors, focusing elements, or the like) suitable for EUV light.

In another embodiment, the method 600 includes a step 604 of collecting light from the sample corresponding to an imaging pupil distribution, where a center of the imaging pupil distribution corresponds to an off-axis collection angle along the first direction on the sample and at least one of the illumination pupil distribution or the imaging pupil distribution is non-circular.

In another embodiment, the method 600 includes a step 606 of generating an image of the sample based on the collected light.

Any combination of the illumination pupil distribution and the imaging pupil distribution may be non-circular. Further, the extent of the non-circular pupil distribution may be shorter along the first direction than in other directions (e.g., a second direction on the sample perpendicular to the first direction).

For example, a non-circular illumination pupil distribution may facilitate tuning the numerical apertures associated with the incident and/or collected light along the first direction (e.g., within a plane of incidence defined by a surface normal to the sample and a center of the illumination pupil distribution). In one embodiment, the range of numerical apertures associated with the incident light (e.g., the extent of the illumination pupil distribution along the first direction) may be reduced along the first direction and extended in other directions. Accordingly, the angles of the incident light and/or the collected light along the first direction may be selected to be near the surface normal without sacrificing etendue of the incident light. In this regard, performance may be increased relative to a circular illumination pupil distribution without increasing the size, complexity, and/or cost of associated optical components.

By way of another example, a non-circular imaging pupil distribution may facilitate increased collection of scattered light to generate an image of the sample, which may provide increased signal strength and increased image quality relative to a circular illumination pupil without increasing the size, complexity, and/or cost of associated optical components.

In some embodiments, the size of pixels in a detector for generating an image of the sample and/or the magnification of optical components for collecting light from the sample (e.g., in step 604) and generating an image of the sample (e.g., in step 606) may be adjusted to provide uniform resolution of the image of the sample. For example, it may be the case that a non-circular imaging pupil distribution may provide different resolution along different directions. In one embodiment, steps 604 and 606 include imaging the sample with anamorphic magnification and square pixels to provide uniform image resolution along two orthogonal directions. In another embodiment, steps 604 and 606 include imaging the sample with uniform magnification and rectangular pixels sized to provide uniform image resolution along two orthogonal directions. In another embodiment, steps 604 and 606 include imaging the sample with anamorphic magnification and rectangular pixels sized to provide uniform image resolution along two orthogonal directions.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system comprising:
    an illumination source configured to generate extreme ultraviolet (EUV) light;
    one or more illumination optics configured to direct the EUV light to a sample within a range of incidence angles corresponding to an illumination pupil distribution in a pupil plane of the one or more illumination optics, wherein a center of the illumination pupil distribution corresponds to an off-axis incidence angle along a first direction on the sample;
    one or more collection optics configured to collect light from the sample in response to the incident EUV light within a range of collection angles corresponding to an imaging pupil distribution in a pupil plane of the one or more collection optics, wherein a center of the imaging pupil distribution corresponds to an off-axis collection angle along the first direction on the sample, wherein the range of incidence angles and the range of collection angles are non-overlapping, wherein the range of incidence angles is smaller than a selected cut-off angle, wherein at least a portion of the range of collection angles is larger than the selected cut-off angle, wherein at least one of the illumination pupil distribution or the imaging pupil distribution is non-circular with a size along the first direction shorter than a size along a second direction perpendicular to the first direction, wherein at least one of the illumination pupil distribution or the imaging pupil distribution is smaller in directions in a plane of incidence than directions out of the plane of incidence; and a detector configured to receive at least a portion of the light collected by the one or more collection optics.

2. The inspection system of claim 1, wherein the at least one of the illumination or the imaging pupil distribution is elliptical with a major axis along the second direction.

3. The inspection system of claim 1, wherein the imaging pupil distribution is non-circular.

4. The inspection system of claim 3, wherein a sampling resolution of the collected light on the detector is uniform along the first direction and the second direction.

5. The inspection system of claim 3, wherein the detector includes a plurality of rectangular pixels having a short length and a long length, wherein the long length provides sampling of the collected light along first direction, wherein the short length provides sampling of the collected light along the second direction.

6. The inspection system of claim 5, wherein illumination pupil distribution is circular.

7. The inspection system of claim 5, wherein illumination pupil distribution is non-circular.

8. The inspection system of claim 3, wherein the plurality of pixels comprises:
a plurality of square pixels, wherein the one or more collection optics provide a first magnification on the detector for collected light along the first direction, wherein the one or more collection optics provide a second magnification on the detector different than the first magnification for collected light along the second direction.

9. The inspection system of claim 3, wherein a size of the point spread function of the one or more collection optics on the detector corresponds to approximately 4.88 pixels of the detector along the first direction and the second direction.

10. The inspection system of claim 1, wherein the illumination pupil distribution is non-circular.

11. The inspection system of claim 10, wherein the imaging pupil distribution is circular.

12. The inspection system of claim 10, wherein the imaging pupil distribution is non-circular.

13. The inspection system of claim 12, wherein a sampling resolution of the collected light on the detector is uniform along the first direction and the second direction.

14. The inspection system of claim 1, wherein the illumination from the illumination source includes wavelengths below approximately 130 nm.

15. The inspection system of claim 1, wherein the illumination source comprises:
a broadband plasma illumination source.

16. The inspection system of claim 1, wherein the inspection system comprises:
a photomask inspection system.

17. The inspection system of claim 1, wherein the inspection system comprises:
a wafer inspection system.

18. The inspection system of claim 1, wherein the cut-off angle is selected based on an angular reflectivity of the sample.

19. The inspection system of claim 1, wherein the cut-off angle is selected based on at least one of a physical size or a focusing power of the one or more illumination optics.

20. A photomask inspection system comprising:
an illumination source configured to generate an illumination beam;
one or more illumination optics configured to direct the illumination beam to a photomask within a range of incidence angles corresponding to an illumination pupil distribution in a pupil plane of the one or more illumination optics, wherein a center of the illumination pupil distribution corresponds to an off-axis incidence angle along a first direction on the photomask;
one or more collection optics configured to collect light from the photomask in response to the incident illumination beam within a range of collection angles corresponding to an imaging pupil distribution in a pupil plane of the one or more collection optics, wherein a center of the imaging pupil distribution corresponds to an off-axis collection angle along the first direction on the photomask, wherein the range of incidence angles and the range of collection angles are non-overlapping, wherein the range of incidence angles is smaller than a selected cut-off angle, wherein at least a portion of the range of collection angles is larger than the selected cut-off angle, wherein at least one of the illumination pupil distribution or the imaging pupil distribution is non-circular with a size along the first direction smaller than a size along a second direction perpendicular to the first direction, wherein at least one of the illumination pupil distribution or the imaging pupil distribution is smaller in directions in a plane of incidence than directions out of the plane of incidence; and
a detector configured to receive at least a portion of the light collected by the one or more collection optics and generate one or more detection signals associated with the received light.

21. The photomask inspection system of claim 20, wherein a spectrum of the illumination beam includes extreme ultraviolet (EUV) light.

22. The photomask inspection system of claim 21, wherein the illumination from the illumination source includes wavelengths below approximately 130 nm.

23. The photomask inspection system of claim 20, wherein the illumination source comprises:
a broadband plasma illumination source.

24. The photomask inspection system of claim 20, wherein the at least one of the illumination or the imaging pupil distribution is elliptical with a major axis along the second direction.

25. The photomask inspection system of claim 20, wherein the imaging pupil distribution is non-circular.

26. The photomask inspection system of claim 25, wherein a sampling resolution of the collected light on the detector is uniform along the first direction and the second direction.

27. The photomask inspection system of claim 25, wherein the detector includes a plurality of rectangular pixels having a short length and a long length, wherein the long length provides sampling of the collected light along first direction, wherein the short length provides sampling of the collected light along the second direction.

28. The photomask inspection system of claim 27, wherein illumination pupil distribution is circular.

29. The photomask inspection system of claim 27, wherein illumination pupil distribution is non-circular.

30. The photomask inspection system of claim 25, wherein the plurality of pixels comprises:
a plurality of square pixels, wherein the one or more collection optics provide a first magnification on the detector for collected light along the first direction, wherein the one or more collection optics provide a second magnification on the detector different than the first magnification for collected light along the second direction.

31. The photomask inspection system of claim 25, wherein a size of the point spread function of the one or more collection optics on the detector corresponds to approximately 4.88 pixels of the detector along the first direction and the second direction.

32. The photomask inspection system of claim 20, wherein the illumination pupil distribution is non-circular.

33. The photomask inspection system of claim 32, wherein the imaging pupil distribution is circular.

34. The photomask inspection system of claim 32, wherein the imaging pupil distribution is non-circular.

35. The photomask inspection system of claim 34, wherein a sampling resolution of the collected light on the detector is uniform along the first direction and the second direction.

36. An inspection method comprising:
  directing extreme ultraviolet (EUV) light to a sample within a range of incidence angles corresponding to an illumination pupil distribution in a pupil plane of one or more illumination optics, wherein a center of the illumination pupil distribution corresponds to an off-axis incidence angle along a first direction on the sample;
  collecting light from the sample in response to the incident EUV light within a range of collection angles corresponding to an imaging pupil distribution in a pupil plane of one or more collection optics, wherein a center of the imaging pupil distribution corresponds to an off-axis collection angle along the first direction on the sample, wherein the range of incidence angles and the range of collection angles are non-overlapping, wherein the range of incidence angles is smaller than a selected cut-off angle, wherein at least a portion of the range of collection angles is larger than the selected cut-off angle, wherein at least one of the illumination pupil distribution or the imaging pupil distribution is non-circular with a size along a first direction shorter than a size along a second direction perpendicular to the first direction, wherein at least one of the illumination pupil distribution or the imaging pupil distribution is smaller in directions in a plane of incidence than directions out of the plane of incidence; and
  generating, with a detector, an image of the sample based on at least a portion of the light collected by the one or more collection optics.

* * * * *